(12) United States Patent
Tashiro et al.

(10) Patent No.: US 7,050,538 B2
(45) Date of Patent: May 23, 2006

(54) RADIATION IMAGING APPARATUS AND RADIATION IMAGING SYSTEM USING THE SAME

(75) Inventors: Kazuaki Tashiro, Kanagawa (JP); Noriyuki Kaifu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/695,914

(22) Filed: Oct. 30, 2003

(65) Prior Publication Data

US 2004/0086079 A1    May 6, 2004

Related U.S. Application Data

(62) Division of application No. 10/127,451, filed on Apr. 23, 2002, now Pat. No. 6,671,347.

(30) Foreign Application Priority Data

Apr. 27, 2001  (JP) .............................. 2001-132349
Mar. 15, 2002  (JP) .............................. 2002-072357

(51) Int. Cl.
*G01T 1/24* (2006.01)
*H01L 27/00* (2006.01)

(52) U.S. Cl. .............................. 378/98.8; 250/370.09; 250/370.11

(58) Field of Classification Search ................ 378/19, 378/98.9, 98.8; 250/370.09, 370.11
See application file for complete search history.

(56) References Cited

U.S. PATENT DOCUMENTS

| | | | |
|---|---|---|---|
| 4,810,881 A | 3/1989 | Berger et al. | 250/370.01 |
| 5,059,800 A | 10/1991 | Cueman et al. | 250/367 |
| 5,434,418 A * | 7/1995 | Schick | 250/370.11 |
| 5,545,899 A | 8/1996 | Tran et al. | 250/370.09 |
| 5,629,524 A | 5/1997 | Stettner et al. | 250/370.09 |
| 5,777,335 A * | 7/1998 | Mochizuki et al. | 250/370.09 |
| 5,825,032 A | 10/1998 | Nonaka et al. | 250/370.09 |
| 6,035,013 A | 3/2000 | Orava et al. | 378/37 |
| 6,204,506 B1 | 3/2001 | Akahori et al. | 250/370.09 |
| 6,333,963 B1 | 12/2001 | Kaifu et al. | 378/98.2 |
| 6,479,827 B1 | 11/2002 | Hamamoto et al. | 250/370 |
| 6,528,796 B1 | 3/2003 | Kaifu et al. | 250/370.11 |
| 6,658,082 B1 * | 12/2003 | Okumura et al. | 378/19 |
| 6,717,151 B1 * | 4/2004 | Tashiro et al. | 250/370.11 |
| 6,800,836 B1 * | 10/2004 | Hamamoto et al. | 250/208.1 |
| 6,800,857 B1 * | 10/2004 | Kajiwara et al. | 250/368 |

* cited by examiner

*Primary Examiner*—Allen C. Ho
(74) *Attorney, Agent, or Firm*—Fitzpatrick, Cella, Harper & Scinto.

(57) ABSTRACT

A radiation imaging apparatus includes a plurality of spaced apart imaging elements comprising each a plurality of pixels and an external terminal for external connection, wherein a lead constituting the external terminal is extended to the side portion opposite to a light receiving surface of each of the spaced apart imaging elements through a space between the adjacent imaging elements, a first planarizing layer is formed on the light receiving surface to be positioned at the same height as the external terminal or on the incidence side based on the height of the light receiving surface, and a wavelength converter is formed on the plurality of spaced apart imaging elements through a second planarizing layer formed on the external terminal and the first planarizing layer.

1 Claim, 12 Drawing Sheets

ONE PIXEL CIRCUIT

RADIATION IMAGING APPARATUS AND RADIATION IMAGING SYSTEM USING THE SAME

This application is a division of application Ser. No. 10/127,451, filed Apr. 23, 2002.

BACKGROUND OF THE INVENTION

1. Field of the Invention

The present invention relates to radiation imaging apparatuses and radiation imaging systems using X-rays, $\alpha$-rays, $\beta$-rays, $\gamma$-rays, and the like.

2. Description of the Related Art

In various medical fields, digitization of information has recently been advanced. For example, in the field of X-ray diagnosis using radiation, a two-dimensional radiation imaging apparatus has been developed for digitizing image information. A radiation imaging apparatus of a forty-three-cm square at most has been developed for use in mammography and chest radiography.

Such an imaging apparatus comprises a plurality of imaging elements which are arranged in a tile-like form to provide large-area radiation imaging. The imaging elements include CCD imaging elements, MOS imaging elements, CMOS imaging elements, and the like.

Radiation imaging for medical diagnosis is frequently performed by, for example, a film screen system comprising a combination of an intensifying screen and a radiographic film. In this system, X-rays transmitted through an object contain information regarding the inside of that object, and the X-rays are converted into visible light proportional to the strength of the X-rays by the intensifying screen to expose the X-ray film to the visible light.

Also, an X-ray digital imaging apparatus has recently come into use, in which X-rays are converted into visible light proportional to the strength of the X-rays by a fluorescent material, converted into electrical signals by a photoelectric transducer (photodiode), and then converted into digital signals by an analog-to-digital (A/D) converter.

U.S. Pat. No. 4,810,881 discloses such an imaging apparatus comprising a plurality of imaging elements.

FIG. 13 shows the example disclosed in U.S. Pat. No. 4,810,881 in which a plurality of modules each comprising a glass substrate and a member of a fluorescent material or the like formed on the glass substrate are connected. FIG. 13 is a sectional view taken along the arrangement direction of the modules.

In FIG. 13, reference numeral 3 denotes a reading means; reference numeral 4, a module; reference numeral 5, a glass substrate; reference numeral 6, an X-ray shield; reference numeral 8, a connection line for connecting a line connection portion 30 and the reading means 3; reference numeral 30, the line connection portion; reference numeral 80, a transparent conductive layer; reference numeral 90, a photodetection layer; and reference numeral 107, a scintillator. A combination of a plurality of these modules provides a large-area X-ray imaging apparatus.

In the conventional technique shown in FIG. 13, the scintillator is uniformly formed on each of the modules. However, when the scintillators are formed after the glass substrates (imaging elements) are combined, the scintillators cannot be uniformly formed in the spaces between the adjacent imaging elements because spaces for passing the connecting lines are present between the respective glass substrates. Therefore, nonuniformity occurs in the scintillators near the spaces, and a uniform light quantity distribution cannot be obtained. In this specification, "nonuniformity in the scintillators" represents discontinuity of crystallinity or thickness of the scintillators.

When a planarizing layer is formed on a plurality of spaced apart imaging elements in order to uniformly form the scintillators, the planarizing layer cannot be easily formed because an adhesive or an organic resin rises in an external terminal disposed on each of the spaced apart imaging elements. Particularly, it is difficult to form the planarizing layer by bonding an adhesive sheet as an adhesive.

SUMMARY OF THE INVENTION

Accordingly, an object of the present invention is to provide a radiation imaging apparatus permitting a planarizing layer to be formed by coating or bonding an adhesive, an organic resin, an adhesive sheet, or the like on a plurality of spaced apart imaging elements, and a radiation imaging system using the radiation imaging apparatus.

In order to achieve the object, in an aspect of the present invention, a radiation imaging apparatus comprises a plurality of spaced apart imaging elements each comprising a plurality of pixels and an external terminal for external connection, wherein a lead constituting the external terminal is extended to the side portion opposite to a light receiving surface of each of the spaced part imaging elements through a space between the adjacent imaging elements, the external terminal is formed at the same height as the light receiving surface or on the side portion opposite to the incidence side based on the height of the light receiving surface, and a wavelength converter is formed on the plurality of spaced apart imaging elements and the external terminals through a planarizing layer.

In another aspect of the present invention, a radiation imaging apparatus comprises a plurality of spaced apart imaging elements each comprising a plurality of pixels and an external terminal for external connection, wherein a lead constituting the external terminal is extended to the side opposite to a light receiving surface of each of the spaced apart imaging elements through a space between the adjacent imaging elements, a first planarizing layer is formed on the light receiving surface to be positioned at the same height as the external terminal or on the incidence side based on the height of the light receiving surface, and a wavelength converter is formed on the plurality of spaced apart imaging elements through a second planarizing layer formed on the external terminals and the first planarizing layers.

Further objects, features and advantages of the present invention will become apparent from the following description of the preferred embodiments with reference to the attached drawings.

DESCRIPTION OF THE PREFERRED EMBODIMENTS

Embodiments of the present invention will be described below with reference to the attached drawings.

First Embodiment

Figure 1:
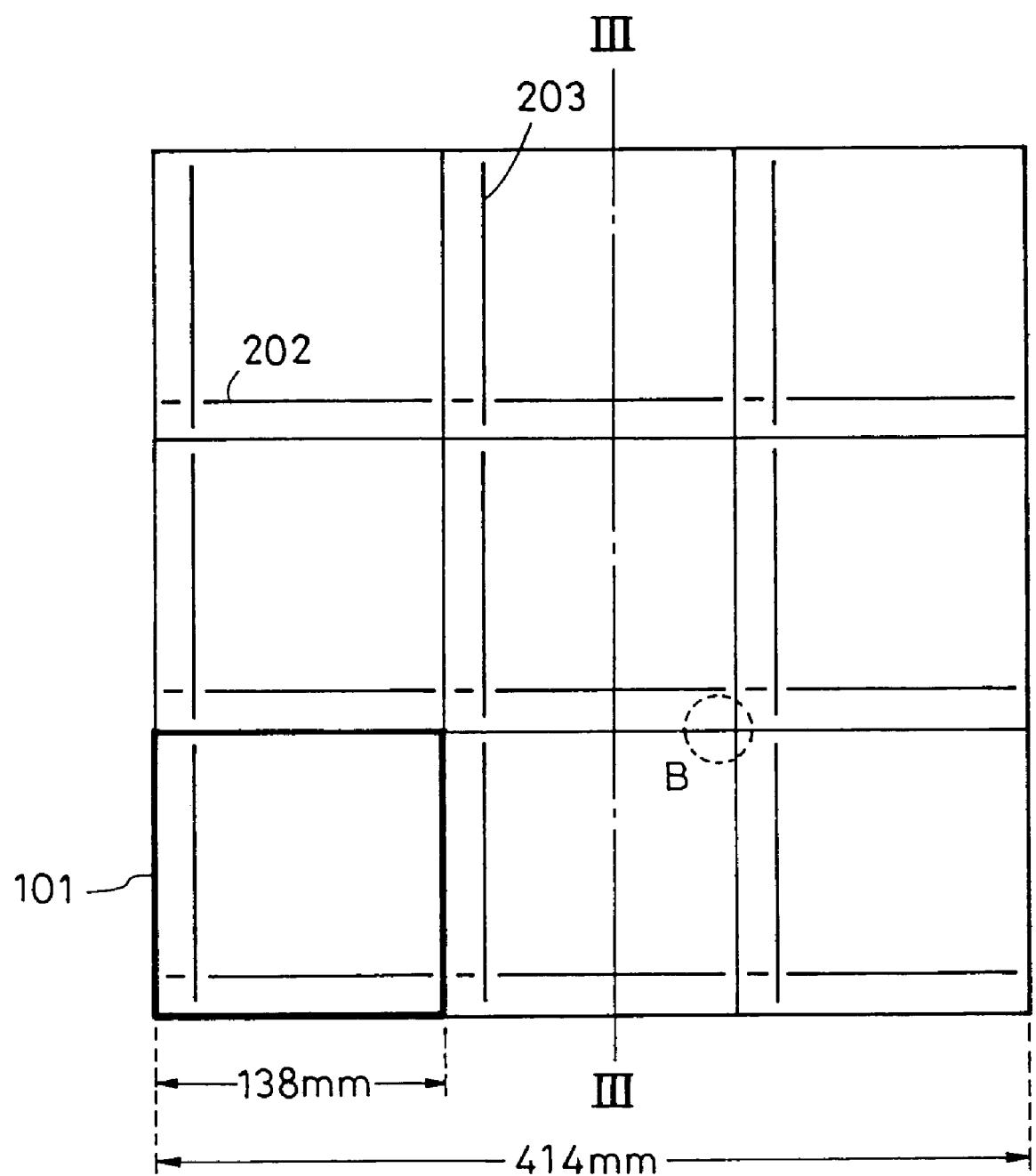
FIG. 1 is a plan view showing the construction of a radiation imaging apparatus according to a first embodiment of the present invention.

FIG. 1 is a plan view showing the construction of a radiation imaging apparatus according to a first embodiment of the present invention.

In FIG. 1, reference numeral 101 denotes an imaging element (shown by a thick frame); reference numeral 202, a horizontal shift register serving as a scanning circuit for reading out signals; and reference numeral 203, a vertical shift register serving as another scanning circuit for reading out signals.

In the radiation imaging apparatus of this embodiment, nine 138-mm square spaced apart imaging elements 101 are arranged in a tile-like form to form a 414-mm square imaging area.

Each of the spaced apart imaging elements 101 comprises the vertical shift register 203, the horizontal shift register 202, and a silicon substrate, or the like (not shown in the drawing), on a surface of which a plurality of pixels are arranged in a two-dimensional manner. Furthermore, an interlayer insulating layer comprising a silicon oxide film or the like, metal wiring made of aluminum or the like, and a protecting layer comprising a nitride film and/or polyimide or the like are formed on the pixels. Each of the pixels (not shown in the drawing) comprises a photodiode, a MOS transistor, and the like.

Figure 2:
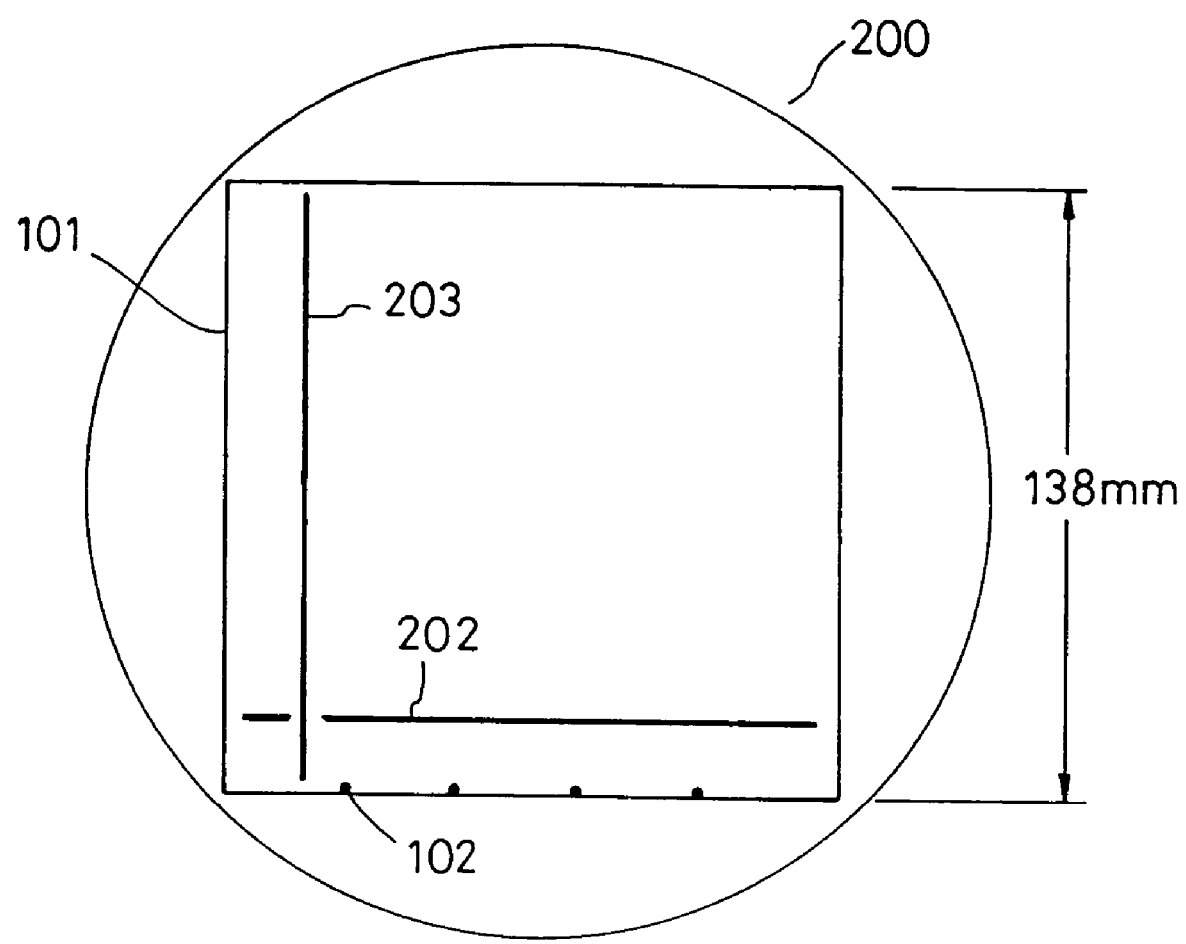
FIG. 2 is a plan view showing an eight-inch wafer for cutting out an imaging element of the radiation imaging apparatus shown in FIG. 1.

FIG. 2 is a plan view showing an eight-inch wafer for cutting out each of the spaced apart imaging elements 101 of the radiation imaging apparatus shown in FIG. 1.

In FIG. 2, reference numeral 102 denotes an electrode pad constituting an external terminal formed at an end of the imaging element 101, and reference numeral 200 denotes an eight-inch wafer.

The 138-mm square CMOS-type imaging element 101 is cut out of the wafer.

The present invention is not limited to the CMOS-type imaging element, and CCD imaging elements and MOS imaging elements may be used as the spaced apart imaging elements. Of course, the size of the spaced apart imaging elements may vary depending on a variety of factors, and is thus not limited to this embodiment. As shown in FIGS. 1 and 2, the horizontal shift register 202 and the vertical shift register 203 are formed within the area of each of the spaced apart imaging elements 101. It is to be appreciated that even if a plurality of the spaced apart imaging elements 101 are arranged as shown in FIG. 1, no dead space occurs in the peripheries of the spaced apart imaging elements 101. Therefore, by arranging the spaced apart imaging elements 101 in a tile-like form, a radiation imaging apparatus having a continuous imaging area can be constructed.

Figure 3:
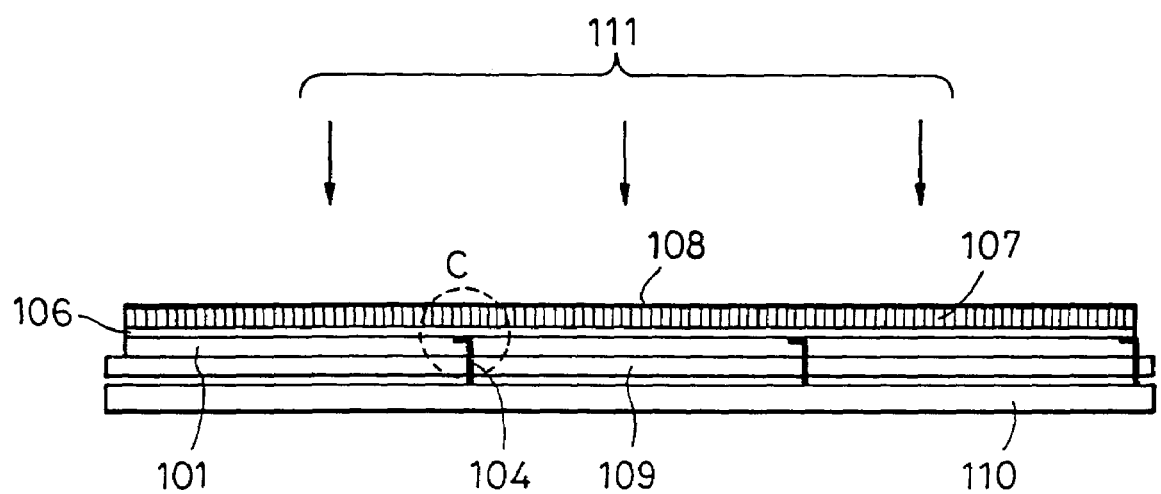
FIG. 3 is a schematic sectional view of the radiation imaging apparatus shown in FIG. 1 taken along line III—III in FIG. 1.

FIG. 3 is a schematic sectional view of the radiation imaging apparatus shown in FIG. 1 taken along line III—III in FIG. 1.

In FIG. 3, reference numeral 104 denotes flexible substrates serving as leads extended through spaces between the adjacent imaging elements 101, for electrically connecting the electrode pad 102 and an external processing substrate 110; reference numeral 106, a light transmitting substrate for covering the spaced apart imaging elements 101; and reference numeral 107, a scintillator serving as a wavelength converter for converting incident radiation into light. The type of scintillator 107 is preferably selected so that the light emission wavelength is suitable for the sensitivity of the spaced apart imaging elements 101. Reference numeral 108 denotes an Al film serving as a light reflection plate (and as a protecting film); reference numeral 109, a base on which a plurality of the spaced apart imaging elements 101 are arranged; reference numeral 110, the external processing substrate having a circuit for supplying a power supply, a clock, and the like to the spaced apart imaging elements 101, and for taking out and processing signals from the spaced apart imaging elements 101; and reference numeral 111, X-rays incident as radiation.

Figure 4:
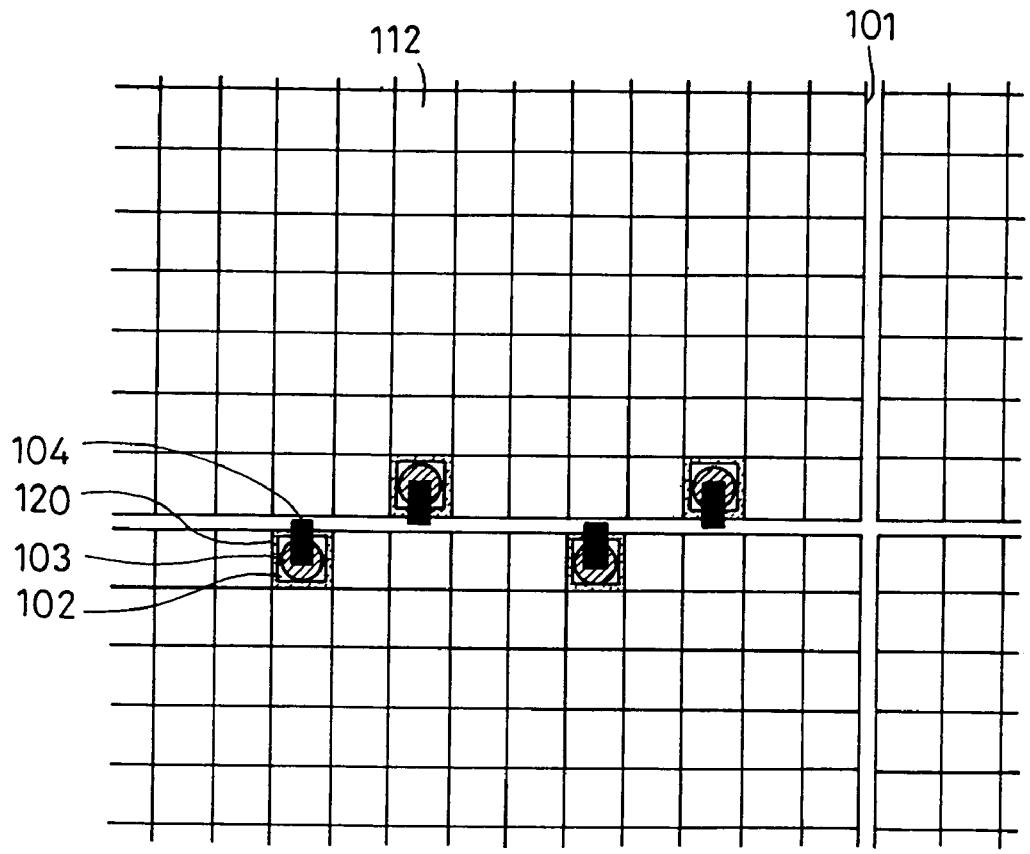
FIG. 4 is an enlarged plan view showing region B of the radiation imaging apparatus shown in FIG. 1.

In the radiation imaging apparatus of this embodiment, when the X-rays 111 are incident, the X-rays 111 are converted into light by the scintillator 107, and the light is absorbed by the photodiodes of the pixels arranged in a two-dimensional form to be converted into electrical signals. The electrical signals are processed by the external processing substrate 110 through the flexible substrates 104. FIG. 4 is an enlarged plan view of region B of the radiation imaging apparatus shown in FIG. 1.

In FIG. 4, reference numeral 103 denotes a bump formed on the electrode pad 102; and reference numeral 112, a pixel including an element for converting light into an electrical charge. The flexible substrates 104 are respectively connected to the bumps 103. Reference numeral 120 denotes an external terminal comprising the electrode pad 102, the bump 103, and the flexible substrate 104.

As shown in FIG. 4, in each of the spaced apart imaging elements 101, 160-μm square pixels 112 are formed in a two-dimensional form over the entire surface of the imaging element 101, the adjacent imaging elements 101 arranged with spaces of about 50 μm. The spaces of about 50 μm are sufficiently smaller than the pixel pitch of 160 μm. Each of the flexible substrates 104 is extended to the side opposite to a light receiving surface through the space between the adjacent imaging elements 101. The flexible substrates 104 are formed in a thickness of as small as about 30 μm. Therefore, the spaces between the respective spaced apart imaging elements 101, after the spaced apart imaging elements 101 are bonded, can be set to about 50 μm, and no dead space is present in the peripheries of the spaced apart imaging elements 101 to form a state in which no defect occurs in a read image, i.e., a state with substantially no space. In this specification, the light receiving surface represents the interface between the region of each of the spaced apart imaging elements 101 where the external terminal 120 is not formed, and a layer formed on that region.

Figure 5:
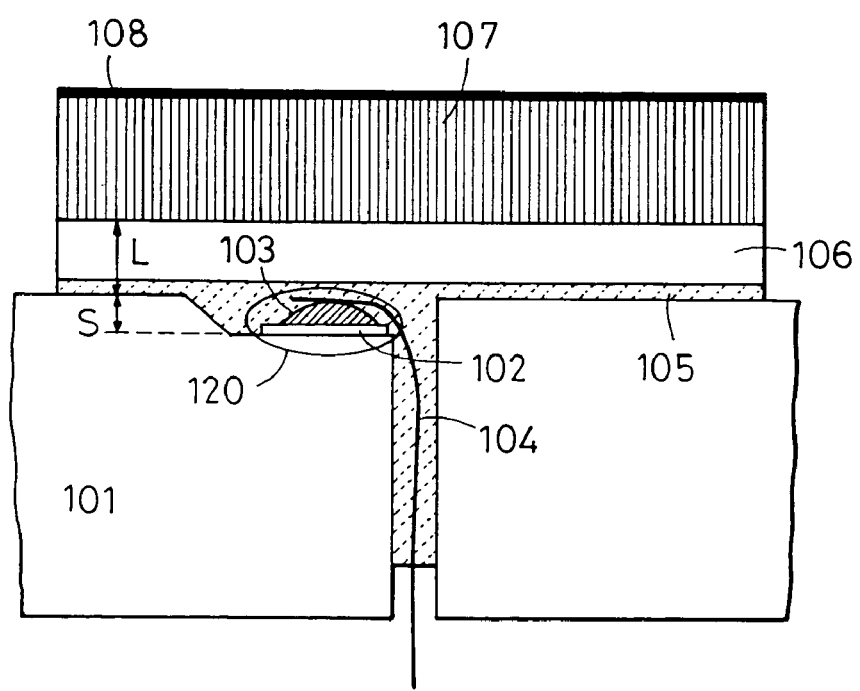
FIG. 5 is an enlarged schematic sectional view showing region C of the radiation imaging apparatus shown in FIG. 3.

FIG. 5 is an enlarged schematic sectional view showing region C of the radiation imaging apparatus shown in FIG. 3.

In FIG. 5, reference numeral 105 denotes an adhesive material serving as a planarizing layer covering the plurality of spaced apart imaging elements 101.

This embodiment is characterized in that the external terminal 120 of each of the plurality of spaced apart imaging elements 101 is formed on the side portion opposite to the incidence side of the light receiving surface (pixel forming area) of each of the plurality of spaced apart imaging elements 101.

In this specification, the incidence side is a higher side of the light receiving surface based on the height of the light receiving surface of each of the plurality of spaced apart imaging elements 101.

In this embodiment, in order to form each of the external terminals 120 on the side portion opposite to the incidence side of the light receiving surface, step S is formed between the light receiving surface and the region in which each external terminal 120 is formed.

A description will now be made of an example of the method of producing each of the external terminals 120 in a region lower than the light receiving surface by the step S on the side portion opposite to the incidence side. First, in pre-processing for forming the spaced apart imaging elements 101, the region where each of the external terminals 120 is to be formed is etched out to make the region lower than the surrounding light receiving surface by the step S before the metal wiring and the protecting layer are formed. Then, the metal wiring made of aluminum or the like is disposed, and the electrode pad 102 constituting each of the external terminals 120 is formed in the pixel region at an end of each of the plurality of spaced apart imaging elements 101 by using a part of the metal wiring.

Next, the protecting layer comprising a nitride film, polyimide, or the like is formed. Then, the protecting layer formed on the electrode pad 102 is removed by etching, and the pump 103 and the flexible substrate 104 are connected the electrode pad 102 to form each of the external terminals 120. Each of the flexible substrates 104 is then bent along the edge of the spaced apart imaging element 101 and connected to the bump 103. The nine spaced apart imaging elements 101 on each of which the external terminal 120 is formed as described above are arranged so that the light receiving surfaces are at the same height, and bonded in a tile-like form on the base 109. Then, the flexible substrates 104 are electrically connected to the external processing substrate 110 arranged at the position shown in FIG. 3.

As described above, the region in which each of the external terminals 120 is formed is lower than the light receiving surface by the step S on the side portion opposite to the incidence side.

The step S may be higher than or the same as each of the external terminals 120.

In this embodiment, the height of the step S is 45 μm from the light receiving surface, and the height of the external terminals 120 is about 40 μm. Therefore, each of the external terminals 120 is formed on the side opposite to the incidence side of the light receiving surface. In this construction, each of the external terminals 120 is preferably formed on the side portion opposite to the incidence side of the light receiving surface because the external terminals 120 are not put into contact with the light transmitting member 106 or the scintillator 107 laminated on the flexible substrates 104.

A description will now be made of an example of the method of forming the scintillator 107 on a plurality of the spaced apart imaging elements 101 formed by the above-described method.

First, the adhesive material 105 is coated on a plurality of the spaced apart imaging elements 101, which are bonded together, so as to fill in the spaces between the adjacent imaging elements 101.

Then, a lead-containing radiation shielding plate is formed as the light transmitting member 106.

In this embodiment, a lead-containing X-ray shielding glass plate having a thickness of 50 μm is used. As the light transmitting member, any planarized member may be used. For example, a polyimide film having no radiation shielding ability, but easier to handle than the glass plate and having transparency may be used. Alternatively, a fiber optical plate (FOP) may be used. The fiber optical plate can guide light to the plurality of pixels without dispersing light, and is thus suitable for improving the efficiency of convergence.

As described above, in this embodiment, the adhesive 105 is planarized by using the light transmitting substrate 106 to form a planarizing layer. However, a polyimide resin or the like may be coated and cured to form the planarizing layer. Alternatively, a planarized adhesive sheet having a predetermined thickness may be bonded as the planarizing layer. By bonding such an adhesive sheet, the production process can be simplified by deceasing the number of steps, thereby increasing ease of manufacture, improving yield, and providing a lower cost process.

The scintillator 107 may be formed on the light transmitting substrate 106 by a vaporization process, or the scintillator 107 previously uniformly formed in another step may be bonded to the light transmitting substrate 106. In previously forming the scintillator 107 in another step, the scintillator 107 may be bonded to the light transmitting substrate 106, the reflection plate 108 or a light non-transmitting substrate (not shown in the drawing).

In a construction without the light transmitting substrate 106, the scintillator 107 previously uniformly formed in another step may be bonded.

If the planarized adhesive sheet is used, the scintillator 107 may be formed directly on the adhesive sheet by the evaporation process without the light transmitting substrate 106 formed therebetween.

As the adhesive 105, a photo-curing resin, heat-curing resin, a thermoplastic resin, and the like can be used.

As can be seen from the above description, the present invention can provide a radiation imaging apparatus in which each of the external terminals 120 is formed at the same height as the light receiving surface or on the side portion opposite to the incidence side, and thus the planarizing layer necessary for forming the scintillator can easily be uniformly formed by coating or bonding an adhesive or an organic resin.

Therefore, no disorder occurs in a path in which light is transmitted through the scintillator to make uniform light emission. Consequently, variations in light quantity distribution are decreased and resolution is improved.

Furthermore, by using the adhesive sheet, the production process can be simplified by decreasing the number of steps, thereby increasing ease of manufacture and improving yield. Therefore, the radiation imaging apparatus according to the present invention can be formed by a lower cost process.

When the distance L between the lower surface of the scintillator 107 and the light receiving surfaces is large, light from the scintillator 107 diffuses between the scintillator 107 and the light receiving surfaces to possibly blur an image, thereby deteriorating resolution. However, in this embodiment, each of the external terminals 120 is formed in the region lower than the light receiving surface by the step S on the side portion opposite to the incidence side, and thus the distance L is determined by the thickness of the adhesive 105 as the planarizing layer and the light transmitting substrate 106 regardless of the external terminals 120. The same degree of resolution may be achieved as when the external terminals 120 are not provided between the plurality of spaced apart imaging elements 101. When the light transmitting substrate 106 is not provided, the distance L can be further decreased to form a structure causing less diffusion of light.

When the scintillator 107 is formed by depositing cesium iodide (CsI) via the evaporation process, or a powder scintillator made of $Gd_2O_2$ or the like containing europium or terbium as an activator is dispersed as a transparent resin, and coated to form the scintillator 107, the same effect as described above can be obtained.

When the scintillator 107 is formed on, for example, the reflection plate 108 by the evaporation process without using the light transmitting substrate 106, the scintillator 107 is bonded to the adhesive 105 coated on the plurality of spaced apart imaging elements 101 and the external terminals 102 to absorb all steps and deviations produced in coating the adhesive 105. Therefore, the radiation imaging apparatus having the planarized interface between the adhesive 105 and the scintillator 107 can be provided.

In order to easily form the light receiving surface and the light transmitting substrate 106 or the scintillator 107 in parallel, a method is preferred in which glass beads having a predetermined diameter are added to the adhesive 105, for controlling the thickness of the adhesive 105. Alternatively, before the adhesive is coated, a spacer may be previously provided on the light receiving surface, for regulating the distance between the light receiving surface and the lower surface of the scintillator 107.

A description will now be made of the construction of a pixel which can be used in the radiation imaging apparatus of the present invention.

Figure 6:
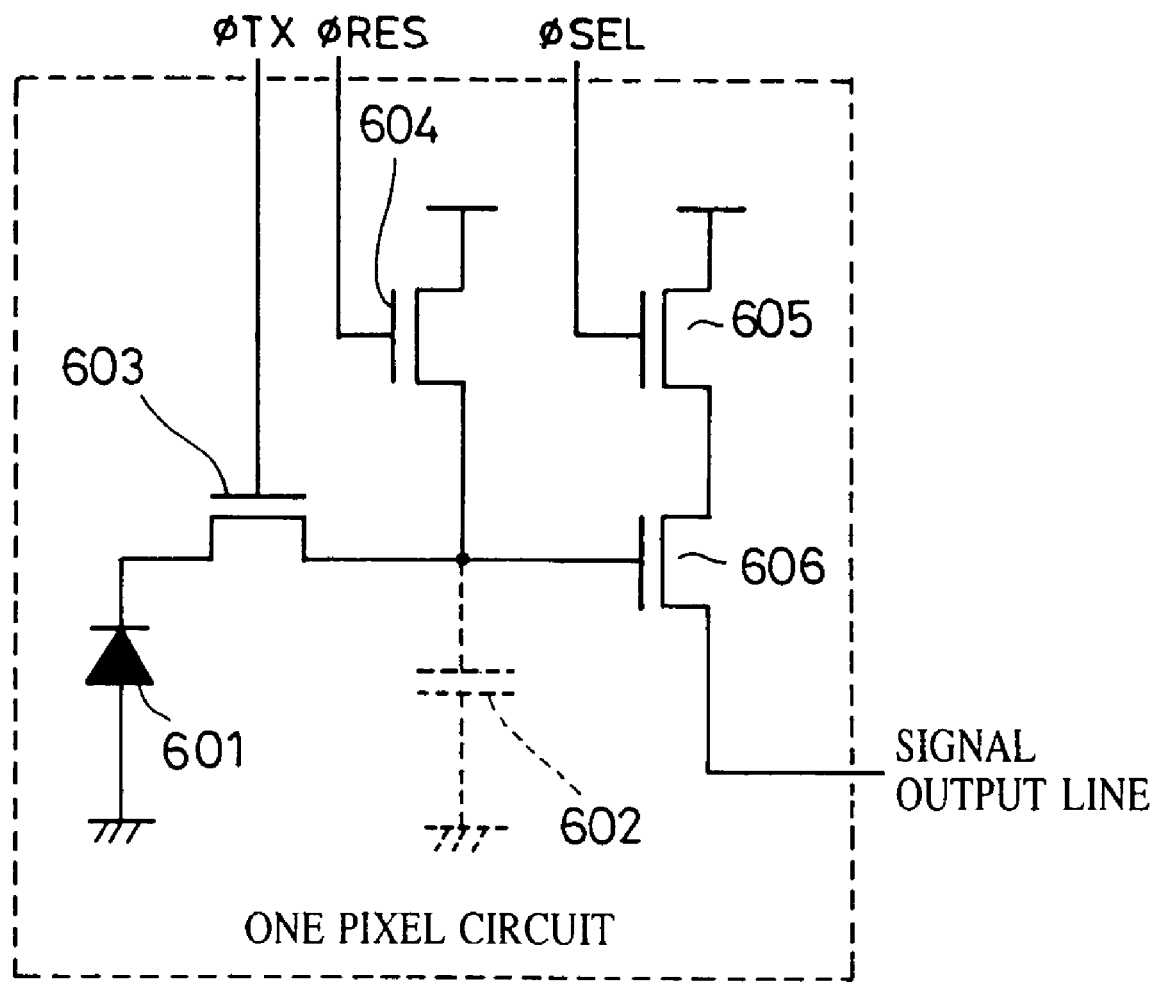
FIG. 6 is a drawing showing an example of the configuration of a one pixel circuit mounted on an imaging element of the present invention.

FIG. 6 is a drawing showing an example of the configuration of a one pixel circuit mounted on the imaging element of the present invention.

In this example, the one pixel circuit has a CMOS structure. In FIG. 6, reference numeral 601 denotes a photodiode for photoelectric conversion; reference numeral 602, a floating diffusion for storing charge; reference numeral 603, a transfer MOS transistor (transfer switch) for transferring charge produced in the photodiode to the floating diffusion 602; reference numeral 604, a reset MOS transistor (reset switch) for discharging the charge stored in the floating diffusion 602; reference numeral 605, a line selection MOS transistor (line selection switch) for selecting a line; and reference numeral 606, an amplification MOS transistor (pixel amplifier) functioning as a source follower.

Figure 7:
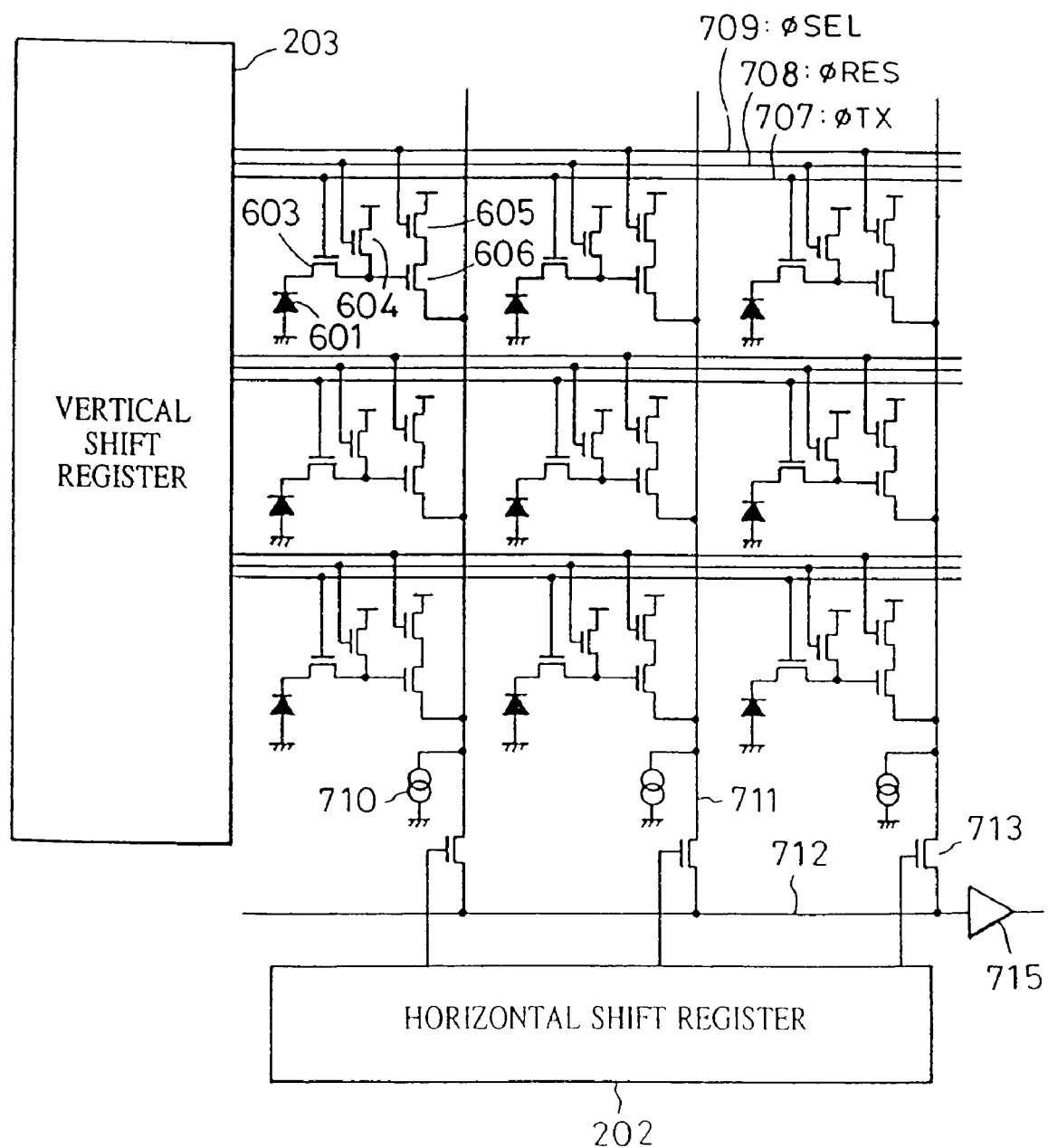
FIG. 7 is a drawing showing an example of equivalent circuits mounted on a radiation imaging apparatus of the present invention using one pixel circuit shown in FIG. 6.

FIG. 7 is a drawing showing an example of equivalent one pixel circuits mounted on the radiation imaging apparatus of the present invention using the one pixel circuit shown in FIG. 6.

Although, in this embodiment, the equivalent circuits comprise 3×3 pixels to form an imaging element, the number of the pixels may vary depending on a variety of factors, and is not limited to this embodiment. Gates of the transfer MOS transistors 603 are connected to φTX 707 extended from the vertical shift register 203, gates of the reset MOS transistors 604 are connected to φRES 708 extended from the vertical shift register 203, and gates of the line selection MOS transistors are connected to φSEL 709 extended from the vertical shift register 203. In FIG. 7, the floating diffusions 602 are omitted.

Photoelectric conversion is performed by the photodiodes 601. During the time of storage of photoelectric charge, the transfer MOS transistors 603 are turned off so that charge subjected to photoelectric conversion by the photodiodes 601 is not transferred to the gates of the amplification MOS transistors 606 constituting the pixel amplifiers. Before storage, the reset MOS transistors 604 are turned on to initialize the gates of the amplification MOS transistors 606 constituting the pixel amplifiers to an appropriate voltage. This is a dark level.

Next, the line selection MOS transistors 605 are turned on to bring the amplification MOS transistors 606 each comprising a load current source 710 and a pixel amplifier 715 in an operating state. Then, the transfer MOS transistors 603 are turned on to transfer the charge stored in the photodiodes 601 to the gates of the amplification MOS transistors 606 constituting the pixel amplifiers.

When the output of the selected line is produced on a vertical output line (signal output line) 711, a column selection switch (multiplexer) 713 is driven by the horizontal shift register 202 to read the output, transferring the read output to the output amplifier 715.

Figure 8:
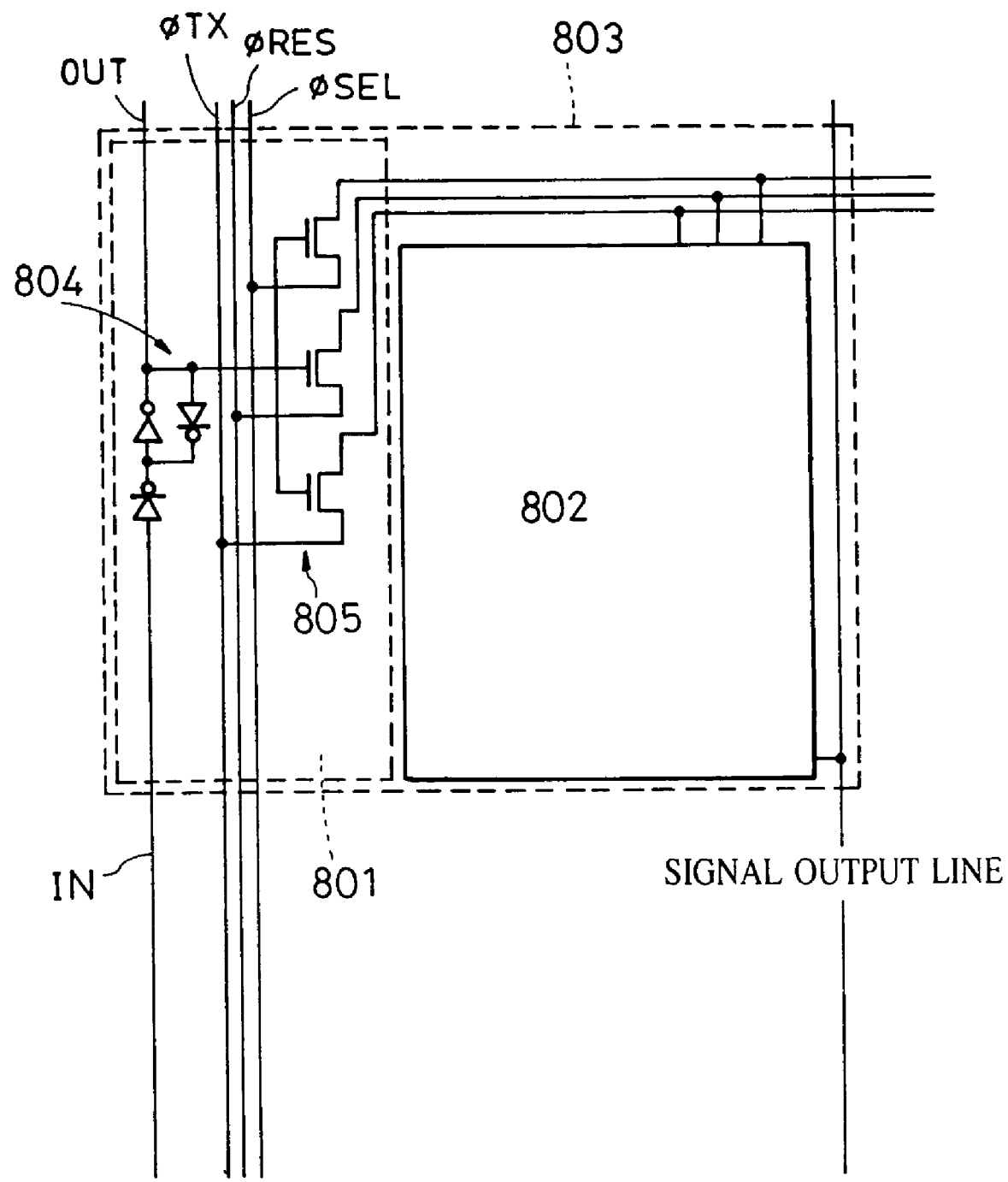
FIG. 8 is a drawing showing the construction of a radiation imaging apparatus of the present invention in which a unit block (unit for selecting and driving one line) of a vertical shift register is arranged in a pixel region (cell) together with a pixel circuit.

FIG. 8 is a drawing showing the configuration of the radiation imaging apparatus of the present invention in which a unit block (a unit for selecting and driving one line) 801 of the vertical shift register 203 is arranged in each pixel region (each cell) 803 together with a one pixel circuit 802. The one pixel circuit 802 is the same as shown in FIG. 6. The circuit constituting the vertical shift resistor 203 is a simple circuit comprising a static shift register 804 and a transfer gate 805, for transmitting a transfer signal, a reset signal and a line selection signal to φTX 707, +RES 708 and φSEL 709, respectively. The static shift register 804 and the transfer gate 805 are driven by a signal from a clock signal line (not shown in the drawing). The circuit configuration of the shift register is not limited to this, and any desired circuit configuration may be used according to the driving methods for pixel addition, decimation reading, and the like.

As shown in FIG. 1, the vertical shift register 203 and the horizontal shift register 202 are arranged in the pixel forming area of each of the plurality of spaced apart imaging elements. Therefore, the unit block 801 of the shift register for processing one line is arranged to be received in a pixel pitch. Namely, these blocks are arranged in a line to form the vertical shift register and the horizontal shift register. The blocks are arranged in a line in each of the vertical direction and the horizontal direction.

Second Embodiment

A second embodiment of the present invention will be described below.

Figure 9:
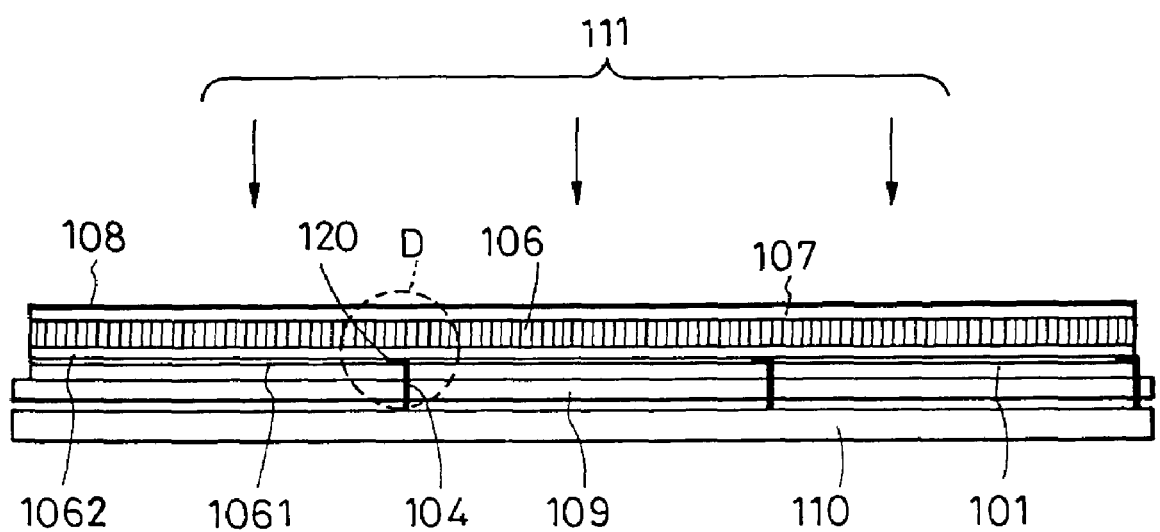
FIG. 9 is a schematic sectional view showing the construction of a radiation imaging apparatus according to a second embodiment of the present invention.

FIG. 9 is a schematic sectional view showing the construction of a radiation imaging apparatus according to the second embodiment of the present invention.

In FIG. 9, reference numeral 1061 denotes a first planarizing layer formed on the light receiving regions of the light receiving surfaces of spaced apart imaging elements 101; reference numeral 1062, a second planarizing layer formed on the spaced apart imaging elements 101 through the first planarizing layer 1061 and the external terminals 120; and reference numeral 106, a fiber optical plate serving as a light transmitting optical substrate.

The portions denoted by the same reference numerals as the first embodiment are not described below.

Figure 10:
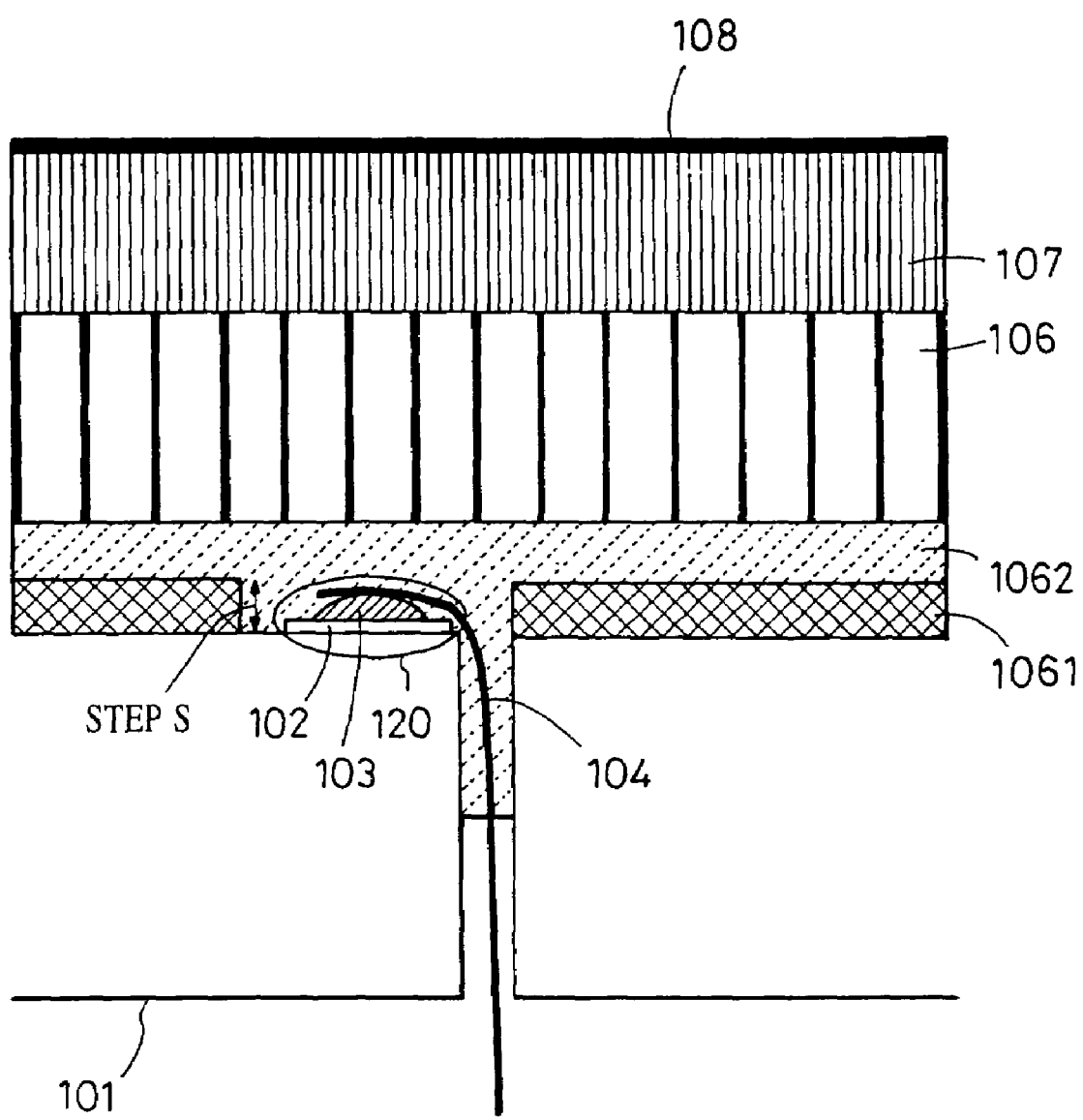
FIG. 10 is an enlarged schematic sectional view showing region D of the radiation imaging apparatus shown in FIG. 9.

FIG. 10 is an enlarged schematic sectional view of region D of the radiation imaging apparatus shown in FIG. 9.

The second embodiment is different from the first embodiment in that step S is formed by forming the first planarizing layer 1061 on the light receiving regions. The light receiving regions represent the regions of the light receiving surfaces of the plurality of spaced apart imaging elements 101, in which the external terminals 120 are not formed.

In the second embodiment, the fiber optical plate (FOP) of a 1× magnification optical system is disposed as the light transmitting substrate 106 between the scintillator 107 and the plurality of spaced apart imaging elements 101 through the first planarizing layer 1061 and the second planarizing layer 1062, to improve the efficiency of convergence. Alternatively, a lead-containing radiation shield plate may be used as the light transmitting substrate 106 in place of the fiber optical plate, or a light transmitting polyimide thin film having no ability to shield radiation, but which is easier to handle than the glass plate may be used.

Alternatively, the scintillator 107 may be formed directly on the second planarizing layer 1062 by evaporation or bonding without the light transmitting substrate 106.

In this embodiment, in the configuration of the plurality of spaced apart imaging elements 101, a plurality of pixels are formed over the entire surface of a single crystal silicon substrate, or the like, and the vertical and horizontal shift registers are also formed thereon. Each of the plurality of pixels comprises a photodiode and a MOS transistor, and each of the shift resistors comprises a MOS transistor. Furthermore, an interlayer insulating layer comprising a silicon oxide film, metal wiring comprising aluminum or the like, and a protecting layer comprising a nitride film or the like is formed on the photodiodes and the MOS transistors. Furthermore, the electrode pad 102 constituting the external terminal 120 is arranged in the pixel area at the end of each of the plurality of spaced apart imaging elements 101. Each of the electrode pads 102 comprises a part of the metal wiring. Unlike in the first embodiment, in the second embodiment, the region where each of the external terminals 120 is formed is not formed by etching in a previous process. Instead, a protecting layer is formed. The portions of the protecting layer, which are formed on the electrode pads 102, are removed by etching. Then, the bump 103 is formed on each of the electrode pads 102.

Then, the first planarizing layer 1061 having a thickness corresponding to the height of the step S is formed on the light receiving regions.

The first planarizing layer 1061 may be formed by any one of coating, lamination, and evaporation methods.

The method of forming the first planarizing layer in this embodiment will be described. First, a photosensitive polyimide resin (which is an example of an organic resin) is coated as the first planarizing layer 1061 on each of the plurality of spaced apart imaging elements 101 in the stage of a wafer, and then partially removed by etching using a mask for the electrode pads 102 and the dicing portions to form the steps S. If polyimide is present in the dicing portions (the cutting portions of the spaced apart imaging elements), dicing teeth are easily clogged. Therefore, the polyimide in the dicing portions is also removed by patterning. Then, the wafer is diced to cut out the respective imaging elements 101. In this embodiment, the first planarizing layer 1061 is also used as the protecting layer for the surface of each of the plurality of spaced apart imaging elements 101. Namely, during dicing and transfer, the spaced apart imaging elements 101 are protected from dust particles, flaws, damages, etc. For example, when an adhesive containing glass beads having a predetermined diameter is used as the second planarizing layer 1062 in order to control the thickness thereof, polyimide can absorb damages to the light receiving surfaces due to the glass beads.

Then, the flexible substrate 104 is bent along the edge portion of each of the plurality of spaced apart imaging elements 101 and connected to the bump 103. Furthermore, nine spaced apart imaging elements 101 are arranged in a tile-like form on the base 109 so that the pixel surfaces are at the same height, and the flexible substrates 104 of the plurality of spaced apart imaging elements 101 are electrically connected to the external processing substrate arranged at the back of the plurality of spaced apart imaging elements 101. The number of the spaced apart imaging elements 101 arranged may vary depending on a variety of factors, and is not limited to this embodiment.

The first planarizing layer 1061 may be formed by coating, lamination or evaporation after the plurality of spaced apart imaging elements 101 are arranged in a tile-like form.

A resin having an adhesive function is coated as the second planarizing layer 1062 on the plurality of the spaced apart imaging elements 101. The resin is coated to fill in the steps S and the spaces between the adjacent imaging elements 101 while absorbing unevenness to form a planarized surface in a same plane on the plurality of spaced apart imaging elements 101.

Alternatively, the second planarizing layer 1062 may be planarized during coating or when the light transmitting substrate 106 is laminated as shown in FIG. 10. In this case, in order to control the thickness, glass beads having a predetermined diameter are preferably added to the resin for forming the second planarizing layer. Alternatively, a planarized adhesive sheet with a thickness previously determined may be used as the second planarizing layer. In use of the adhesive sheet, the production process is simplified by decreasing the number of steps, thereby increasing ease of manufacture, improving yield, and providing a lower cost process.

Then, CsI (T1) is deposited on the second planarizing layer 1062 on the plurality of the spaced apart imaging elements 101. Since CsI is deposited on the planarized layer, CsI can uniformly formed.

Alternatively, the scintillator 107 may be previously formed on, for example, the reflection plate 108 or the like by evaporation or lamination in a separate step, and then laminated on the second planarizing layer 1062.

For the second planarizing layer, a photo-curing resin, a heat-curing resin, a thermoplastic resin or the like can be used as the adhesive. The second planarizing layer may be formed by uniformly coating a polyimide resin or the like and then curing it. The distance L can be further decreased to improve resolution.

The step S of the first planarizing layer 1061 may be at the same height as the external terminals 120.

Besides the method of forming the scintillator 107 by depositing cesium iodide (CsI), the method of dispersing a powder scintillator made of $Gd_2O_2$ or the like containing europium or terbium as an activator in a transparent resin, and then coating the resin to form the scintillator 107 can also produce the same effect as described above.

As described above, in the radiation imaging apparatus of this embodiment, the first planarizing layer having steps S higher than the external terminals 120 is formed on the plurality of the spaced apart imaging elements 101 to facilitate the formation of a planarizing layer necessary for forming the scintillator 107.

Particularly, in the radiation imaging element of this embodiment, an adhesive sheet having a uniform thickness can easily be bonded as the second planarizing layer.

Furthermore, the scintillator is formed on the planarizing layer to remove variations in the optical path in the scintillator, thereby making light emission uniform, and decreasing variations in the light quantity distribution. Therefore, resolution can be improved.

Third Embodiment

Figure 11:
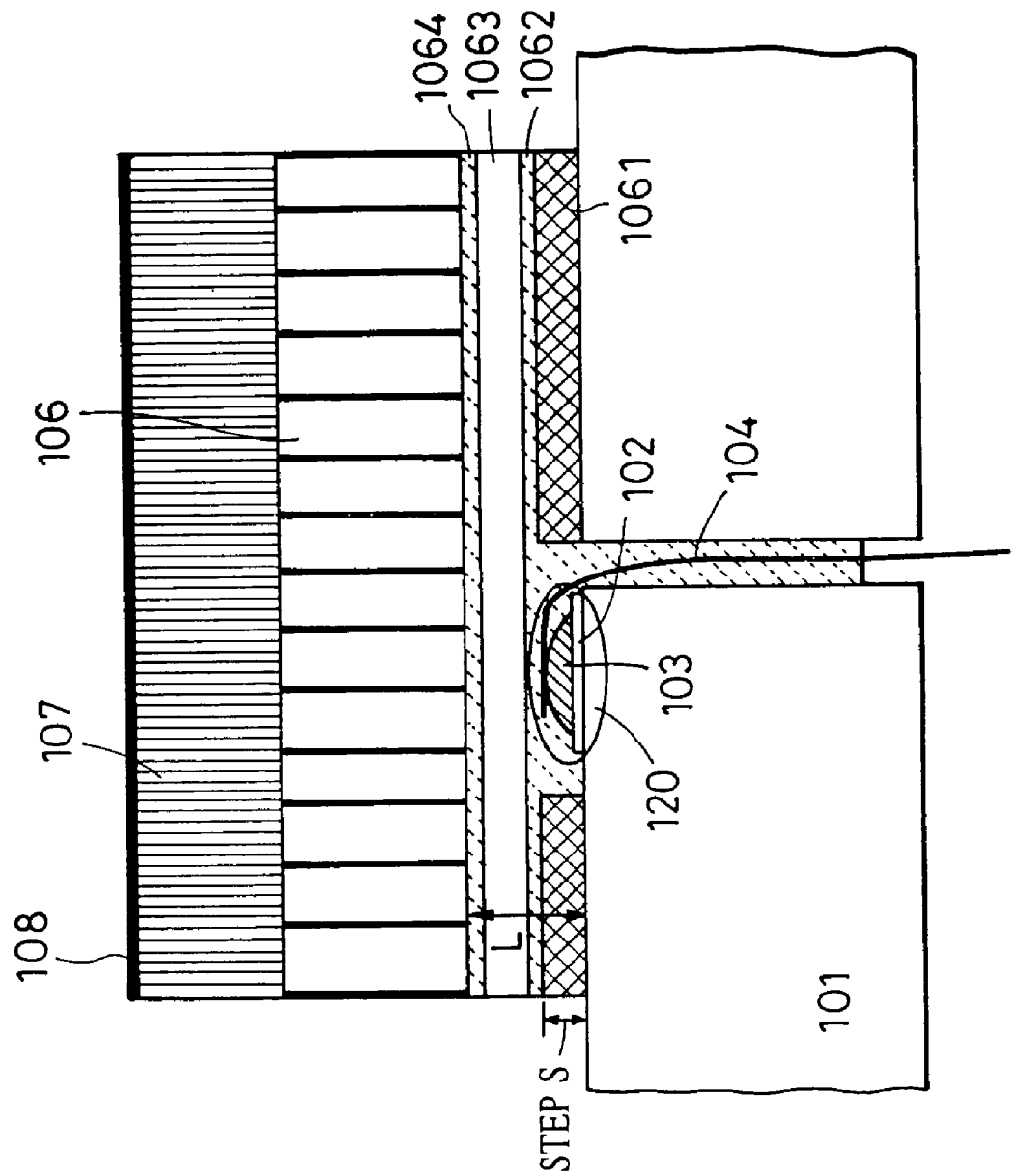
FIG. 11 is a schematic sectional view showing the construction of a radiation imaging apparatus according to a third embodiment of the present invention.

FIG. 11 is a schematic sectional view showing the construction of a radiation imaging apparatus according to a third embodiment of the present invention.

In FIG. 11, reference numeral 1063 denotes a light transmitting substrate other than the fiber optical plate, and reference numeral 1064 denotes an adhesive. In this embodiment, a lead-containing radiation shielding plate is disposed as the light transmitting substrate.

This embodiment is different from the radiation imaging apparatus shown in FIG. 10 in that the light transmitting substrate 1063 other than the fiber optical plate is disposed on the second planarizing layer 1062, and the light transmitting substrate 1063 and the fiber optical plate as the light transmitting substrate 106 are bonded together with an adhesive 1064.

In this embodiment, besides the first and second planarizing layers, the light transmitting substrate 1063 and the adhesive 1064 are used to increase the distance between the lower surface of the scintillator 107 and the light receiving regions. However, the radiation shielding ability is improved to form a structure causing less damage to the plurality of spaced apart imaging elements 101.

Fourth Embodiment

Figure 12:
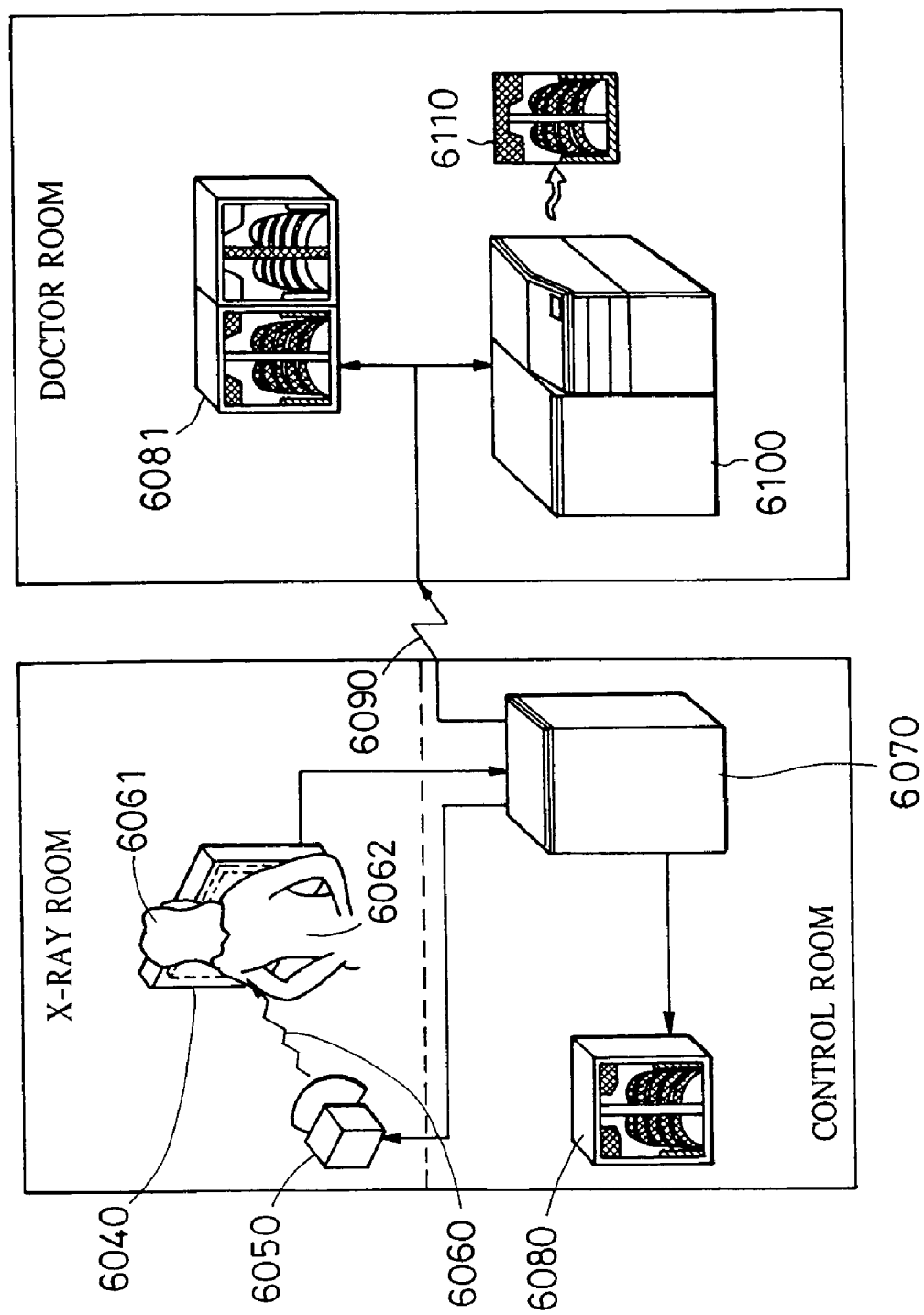
FIG. 12 is a drawing showing an example of application of a radiation imaging apparatus of the present invention to a radiodiagnosis system.
Figure 13:
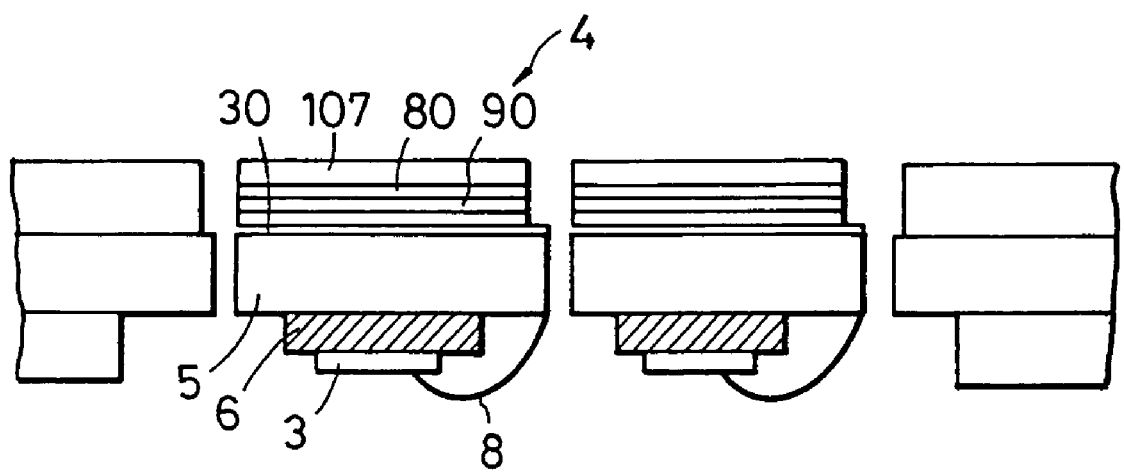
FIG. 13 is a drawing showing a conventional technique.

FIG. 12 is a drawing showing an example of one application of the radiation imaging apparatus of the present invention in a radiodiagnosis system. In this embodiment, an X-ray diagnosis system is described as an example of the radiodiagnosis system.

X-rays 6060 produced in an X-ray tube 6050 are transmitted through the chest region 6062 of a patient or test subject 6061 and incident on a radiation imaging apparatus 6040 comprising the scintillator 107, the fiber optical plate as the light transmitting substrate, the plurality of spaced apart imaging elements 101, and the external processing substrate 110. The incident X-rays contains inside information of the body of the patient 6061.

Light is emitted from the scintillator 107 in response to incidence of X-rays, and subjected to photoelectric conversion by the plurality of spaced apart imaging elements 101 to obtain electrical information. The information is converted into a digital signal, and an image is processed by an image processor 6070 according to the digital signal, and the image is displayed on a display 6080 of a control room.

The information can be transmitted to a remote place by transmission means such as a telephone circuit 6090. The image the can be displayed on a display 6081 in the remote location or can be stored in a storage means such as an optical disk or the like. This may permit diagnosis by another doctor in the remote location. Also, the information can be recorded on a film 6110 by a film processor 6100.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a radiation imaging apparatus comprising:
    a plurality of imaging elements comprising each a plurality of pixels and an external terminal,
    wherein a lead constituting the external terminal extends to the side opposite to a light receiving surface of the imaging element through a space between adjacent imaging elements;
    comprising the following steps of:
    forming a first planarization layer which covers said external terminal, on the light receiving surface;
    forming a second planarization layer on said first planarization layer; and
    forming a scintillator on said second planarization layer.

* * * * *